(12) United States Patent
Toshiyuki et al.

(10) Patent No.: US 10,256,330 B2
(45) Date of Patent: Apr. 9, 2019

(54) SWITCHING CIRCUIT

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Ken Toshiyuki, Seto (JP); Yusuke Shindo, Kariya (JP); Tomotaka Suzuki, Kariya (JP)

(73) Assignees: TOYOTA JIDOSHA KABUSHIKI KAISHA, Toyota-shi (JP); DENSO CORPORATION, Kariya-shi (JP)

( * ) Notice: Subject to any disclaimer, the term of this patent is extended or adjusted under 35 U.S.C. 154(b) by 0 days.

(21) Appl. No.: 15/824,578

(22) Filed: Nov. 28, 2017

(65) Prior Publication Data

US 2018/0151708 A1    May 31, 2018

(30) Foreign Application Priority Data

Nov. 29, 2016 (JP) .................................. 2016-231511

(51) Int. Cl.

| | |
|---|---|
| *H01L 29/739* | (2006.01) |
| *H03K 17/082* | (2006.01) |
| *H03K 17/12* | (2006.01) |
| *H01L 27/088* | (2006.01) |

(Continued)

(52) U.S. Cl.
CPC ..... *H01L 29/7393* (2013.01); *H03K 17/0828* (2013.01); *H03K 17/127* (2013.01); *H03K 17/168* (2013.01); *H01L 27/088* (2013.01); *H01L 29/0696* (2013.01); *H03K 17/166* (2013.01); *H03K 2217/0027* (2013.01); *H03K 2217/0036* (2013.01)

(58) Field of Classification Search
CPC ............. H01L 27/0207; H01L 27/0647; H01L 27/088; H01L 29/66325; H01L 29/7393; H01L 29/7397

See application file for complete search history.

(56) References Cited

U.S. PATENT DOCUMENTS

| | | | |
|---|---|---|---|
| 9,692,405 B2 * | 6/2017 | Na ....................... | H01L 27/0635 |
| 2015/0260780 A1 * | 9/2015 | Osanai .................. | G01R 31/40 |
| | | | 324/762.01 |
| 2016/0233858 A1 * | 8/2016 | Wasekura ........... | H01L 29/7393 |

FOREIGN PATENT DOCUMENTS

| | | |
|---|---|---|
| JP | H05-299990 A | 11/1993 |
| JP | 2007-104805 A | 4/2007 |
| JP | 2016-146717 A | 8/2016 |

* cited by examiner

*Primary Examiner* — Cuong Q Nguyen
(74) *Attorney, Agent, or Firm* — Hunton Andrews Kurth LLP (57) ABSTRACT

A switching circuit may be provided with: a parallel circuit including a first IGBT and a second IGBT connected in parallel; a controller configured to receive a signal indicating a turn-on timing and a turn-off timing. The controller is configured to: turn on both of the first and second IGBTs at the turn-on timing, execute a first control in which one of the first and second IGBTs is turned off before the turn-off timing and the other of the first and second IGBTs is turned off at the turn-off timing in a case where current flowing through the parallel circuit is equal to or lower than a threshold value, and execute a second control in which both of the first and second IGBTs are turned off at the turn-off timing in a case where the current flowing through the parallel circuit is higher than the threshold value.

3 Claims, 7 Drawing Sheets

(51) Int. Cl.
*H01L 29/06* (2006.01)
*H03K 17/16* (2006.01)

SWITCHING CIRCUIT

CROSS-REFERENCE TO RELATED APPLICATION

The present application claims priority to Japanese Patent Application No. 2016-231511 filed on Nov. 29, 2016, which is incorporated herein by reference in its entirety.

TECHNICAL FIELD

The technique disclosed herein relates to a switching circuit.

BACKGROUND

Japanese Patent Application Publication No. 2016-446717 discloses a switching circuit that switches two IGBTs (abbreviation of Insulated Gate Bipolar Transistor) connected in parallel. This switching circuit switches the two IGBTs at same time when current flowing in a parallel circuit thereof is high. In this case, the current flows by being distributed to the two IGBTs, and load applied to each IGBT can be reduced. Further, in this switching circuit, one of the IGBTs is turned off at an off-timing when the current flowing in the parallel circuit is small. The other of the IGBTs is maintained in a normally off state, or is turned off before the off-timing. In this case, a turn-off loss is suppressed by turning off the one of the IGBTs at the off-timing.

In the technique of Japanese Patent Application Publication No. 2016-146717, a control method is switched according to the current at a time when the parallel circuit was previously in an on-state, or a prediction value calculated based on such current. However, in this method, the current that would flow the next time the parallel circuit is turned on cannot be accurately be predicted, and it was difficult to suitably switch the control method according to the current. Due to this, there had been a case where high current flows in the parallel circuit when one of the IGBTs is in the on-state, and excessively large load was applied to the IGBT that is in the on-state. In view of the above, the description herein provides a technique capable of accurately switching a control method according to current flowing in a parallel circuit.

A switching circuit disclosed herein may comprise a wiring; a parallel circuit arranged on the wiring, and including a first IGBT and a second IGBT connected in parallel; a controller configured to receive a signal indicating a turn-on timing and a turn-off timing and switch one or both of the first and second IGBTs according to the signal. The controller is configured to turn on both of the first and second IGBTs at the turn-on timing. The controller is configured to execute a first control in which one of the first and second IGBTs is turned off before the turn-off timing and the other of the first and second IGBTs is turned off at the turn-off timing in a case where current flowing through the parallel circuit when both of the first and second IGBTs are in an on-state is equal to or lower than a threshold value. The controller is configured to execute a second control in which both of the first and second IGBTs are turned off at the turn-off timing in a case where the current flowing through the parallel circuit when both of the first and second IGBTs are in the on-state is higher than the threshold value.

In this switching circuit, the controller turns on both the first and second IGBTs at the turn-on timing. At the turn-on timing, it is difficult to predict the current that would flow in the parallel circuit. However, since both the first and second IGBTs turn on at this stage, the current flows by being distributed to the first and second IGBTs respectively. Accordingly, even if the current flowing in the parallel circuit is high, excessively large current is suppressed from flowing in each of the IGBTs. With the current starting to flow in the parallel circuit at the turn-on timing, control according to the current flowing in the parallel circuit becomes enabled.

In the case where the current flowing in the parallel circuit is equal to or lower than the threshold when both the first and second IGBTs are in the on-state, the controller thereafter performs the first control. In the first control, the one of the first and second IGBTs (which may hereinbelow be referred to as a preceding IGBT) is turned off before the turn-off timing, and the other of the first and second IGBTs (which may hereinbelow be referred to as a subsequent IGBT) is turned off at the turn-off timing. Since the preceding IGBT is turned off first, the current flows thereafter by being accumulated in the subsequent IGBT. However, since the current flowing in the parallel circuit is small, excessively large current can be suppressed from flowing in the subsequent IGBT. Further, since the subsequent IGBT turns off at the turn-off timing, which is after the preceding IGBT had turned off, a turn-off loss is thereby suppressed.

When the current flowing in the parallel circuit when both the first and second IGBTs are in the on-state is higher than the threshold value, the controller performs the second control thereafter. In the second control, both the first and second IGBTs are maintained in the on-state until the turn-off timing, and both the first and second IGBTs are turned off at the turn-off timing. Both the first and second IGBTs are maintained in the on-state over an entirety of a period from the turn-on timing until the turn-off timing when the current flowing in the parallel circuit is high. Due to this, the high current flows by being distributed to both the first and second IGBTs, and load on each IGBT can be reduced.

As above, in this switching circuit, by turning on both the first and second IGBTs at the turn-on timing, the high load is prevented from being applied to each IGBT even in the case where high current flows in the parallel circuit at the turn-on timing. Further, since detection of the current flowing in the parallel circuit is enabled during when both the first and second IGBTs are in the on-state, one of the first and second controls can appropriately be performed according to the current flowing in the parallel circuit. Thus, the high load can be prevented from being applied to each IGBT when the current flowing in the parallel circuit is high, and the turn-off loss can be suppressed when the current flowing in the parallel circuit is low.

DETAILED DESCRIPTION

First Embodiment

Figure 1:
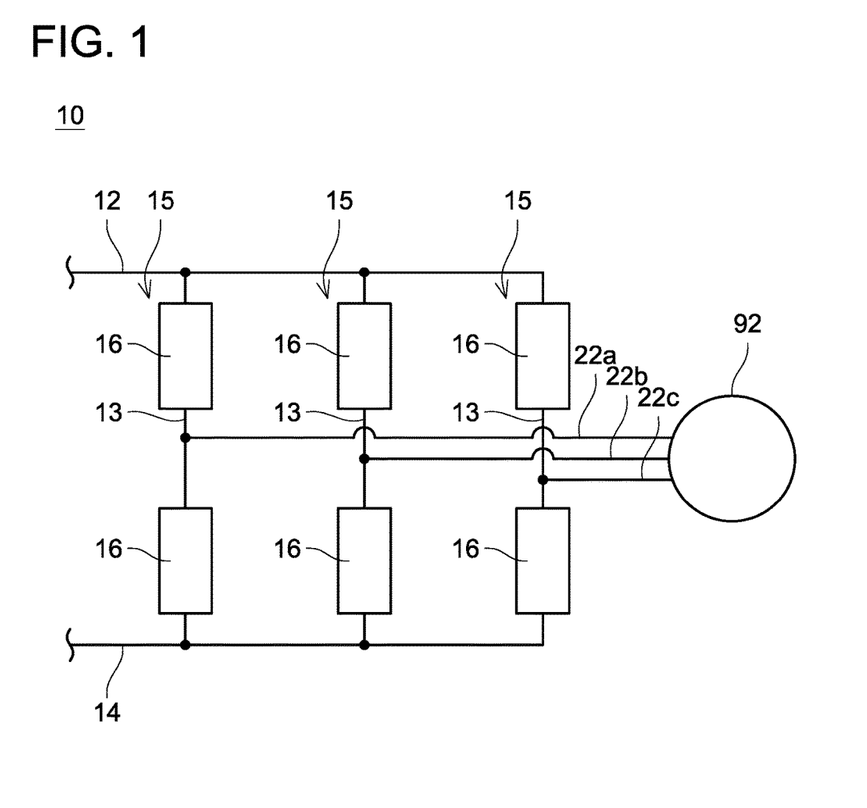
FIG. 1 is a circuit diagram of an inverter circuit 10.

An inverter circuit 10 of a first embodiment shown in FIG. 1 supplies alternating current to a motor 92. The inverter circuit 10 includes a high potential wiring 12 and a low potential wiring 14. The high potential wiring 12 and the low potential wiring 14 are connected to a direct current power source that is not shown. A potential higher than that for the low potential wiring 14 is applied to the high potential wiring 12. Three serial circuits 15 are connected in parallel between the high potential wiring 12 and the low potential wiring 14. Each serial circuit 15 includes a connection wiring 13 connected between the high potential wiring 12 and the low potential wiring 14, and two switching circuits 16 arranged on the connection wiring 13. In each serial circuit 15, the two switching circuits 16 are connected serially between the high potential wiring 12 and the low potential wiring 14. The connection wirings 13 between pairs of the serially-connected two switching circuits 16 are connected to output wirings 22a to 22c. The other ends of the output wirings 22a to 22c are connected to the motor 92. The inverter circuit 10 supplies three-phase alternating current to the motor 92 by switching the respective switching circuits 16.

Figure 2:
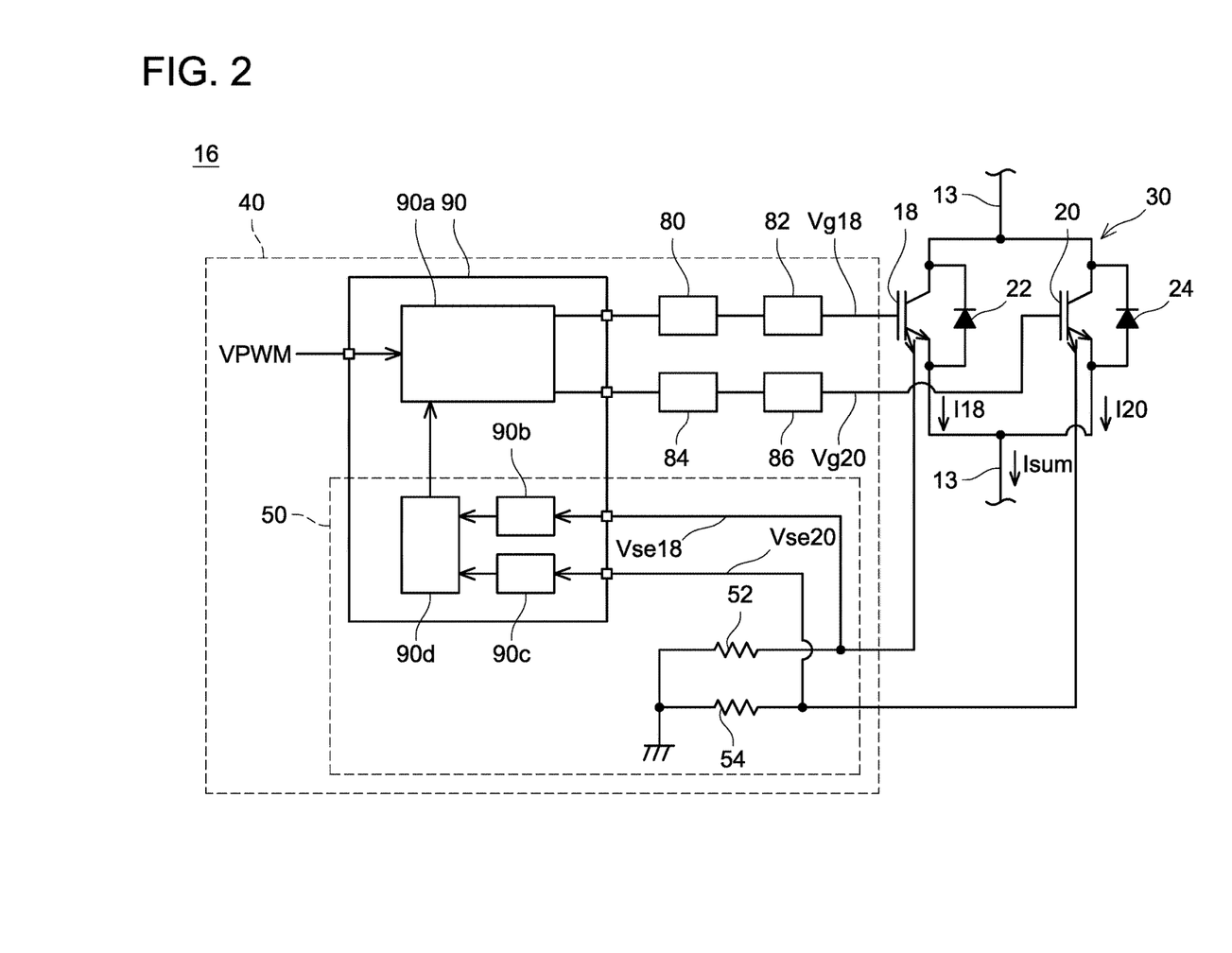
FIG. 2 is a circuit diagram of a switching circuit 16 of a first embodiment.

FIG. 2 shows an internal circuit of one switching circuit 16. It should be noted that configurations of the respective switching circuits 16 are equal to each other. As shown in FIG. 2, the switching circuit 16 includes a first IGBT 18 and a second IGBT 20. The first IGBT 18 and the second IGBT 20 are connected to each other in parallel. That is, a collector of the first IGBT 18 is connected to a collector of the second IGBT 20, and an emitter of the first IGBT 18 is connected to an emitter of the IGBT 20. A parallel circuit 30 is configured by the two IGBTs 18, 20 connected in parallel. The parallel circuit 30 is arranged on the connection wiring 13. The parallel circuit 30 includes diodes 22, 24. The diodes 22, 24 are connected in anti-parallel to corresponding ones of the IGBTs 18, 20. That is, an anode of the diode 22 is connected to the emitter of the first IGBT 18. A cathode of the diode 22 is connected to the collector of the first IGBT 18. An anode of the diode 24 is connected to the emitter of the second IGBT 20. A cathode of the diode 24 is connected to the collector of the second IGBT 20.

The switching circuit 16 of the FIG. 2 includes a gate control circuit 40. The gate control circuit 40 is configured to control a gate potential Vg18 of the first IGBT 18 and a gate potential Vg20 of the second IGBT 20. The gate control circuit 40 includes a logic control circuit 90, a control amplifier 80, a gate charging/discharging circuit 82, a control amplifier 84, and a gate charging/discharging circuit 86.

A signal VPWM is inputted from outside to the logic control circuit 90. The signal VPWM is a pulse signal that transitions between a high potential and a low potential. A duty ratio of the signal VPWM changes according to an operation state of the motor 92. The logic control circuit 90 includes a controller 90a. The controller 90a sends a signal to the control amplifiers 80, 84 based on the signal VPWM and the like to be inputted.

The control amplifier 80 and the gate charging/discharging circuit 82 are circuits for controlling the gate potential Vg18 of the first IGBT 18. The control amplifier 84 and the gate charging/discharging circuit 86 are circuits for controlling the gate potential Vg20 of the second IGBT 20. That is, a control amplifier and a gate charging/discharging circuit are provided for each of the IGBTs 18, 20. Due to this, the gate potential Vg18 of the first IGBT 18 and the gate potential Vg20 of the second IGBT 20 are controlled independently.

The control amplifier 80 sends a signal to the gate charging/discharging circuit 82 based on a signal sent from the logic control circuit 90. The gate charging/discharging circuit 82 includes a plurality of switching elements. The gate charging/discharging circuit 82 is connected to a gate of the first IGBT 18. The signal sent from the control amplifier 80 is applied to each switching element of the gate charging/discharging circuit 82. Due to this, the respective switching elements of the gate charging/discharging circuit 82 switch, and the gate of the first IGBT 18 is thereby charged or discharged. Due to this, the gate potential Vg18 is controlled. As described above, the control amplifier 80 and the gate charging/discharging circuit 82 operate according to the signal from the controller 90a of the logic control circuit 90, and the gate potential Vg18 is thereby controlled.

The control amplifier 84 sends a signal to the gate charging/discharging circuit 86 based on a signal sent from the logic control circuit 90. The gate charging/discharging circuit 86 includes a plurality of switching elements. The gate charging/discharging circuit 86 is connected to a gate of the second IGBT 20. The signal sent from the control amplifier 84 is applied to each switching element of the gate charging/discharging circuit 86. Due to this, the respective switching elements of the gate charging/discharging circuit 86 switch, and the gate of the second IGBT 20 is thereby charged or discharged. Due to this, the gate potential Vg20 is controlled. As described above, the control amplifier 84 and the gate charging/discharging circuit 86 operate according to the signal from the controller 90a of the logic control circuit 90, and the gate potential Vg20 is thereby controlled.

Further, the gate control circuit 40 includes a current detection circuit 50. The current detection circuit 50 is configured by resistances 52, 54 and a part of the logic control circuit 90. The logic control circuit 90 includes current detectors 90b, 90c and a total current calculator 90d. The current detection circuit 50 is configured by the resistances 52, 54, the current detectors 90b, 90c, and the total current calculator 90d.

The resistance 52 is connected between a sensing emitter of the first IGBT 18 and a ground. It should be noted that the ground in FIG. 2 refers to a potential of the emitters of the first IGBT 18 and the second IGBT 20. Sensing current having a certain ratio to main current I18 of the first IGBT 18 (current flowing in a main emitter) flows in this sensing emitter. The sensing current of the first IGBT 18 flows to the ground from the sensing emitter through the resistance 52. Thus, a potential Vse18 of the sensing emitter of the first IGBT 18 (a potential difference between both ends of the resistance 52) takes a potential proportional to the sensing current of the first IGBT 18 (that is, a potential proportional to the main current I18 of the first IGBT 18). The sensing emitter of the first IGBT 18 is connected to the current detector 90b of the logic control circuit 90.

The resistance 54 is connected between a sensing emitter of the second IGBT 20 and the ground. Sensing current having a certain ratio to main current I20 of the second IGBT 20 (current flowing in a main emitter) flows in this sensing emitter. The sensing current of the second IGBT 20 flows to the ground from the sensing emitter through the resistance 54. Thus, a potential Vse20 of the sensing emitter of the second IGBT 20 (a potential difference between both ends of the resistance 54) takes a potential proportional to the sensing current of the second IGBT 20 (that is, a potential proportional to the main current I20 of the second IGBT 20). The sensing emitter of the second IGBT 20 is connected to the current detector 90c of the logic control circuit 90.

The current detector 90b of the logic control circuit 90 calculates the main current I18 of the first IGBT 18 from the potential Vse18 of the sensing emitter of the first IGBT 18. A value of the main current I18 that the current detector 90b calculated is sent to the total current calculator 90d as a digital signal.

The current detector 90c of the logic control circuit 90 calculates the main current I20 of the second IGBT 20 from the potential Vse20 of the sensing emitter of the second IGBT 20. A value of the main current I20 that the current detector 90c calculated is sent to the total current calculator 90d as a digital signal.

The total current calculator 90d of the logic control circuit 90 calculates a value in which the value of the main current I20 of the second IGBT 20 is added to the value of the main current I18 of the first IGBT 18 (that is, a total value of the main current I18 and the main current I20). The total value to be calculated is equal to total current Isum that flows in the connection wiring 13 through the parallel circuit 30. The calculated value of the total current Isum is sent to the controller 90a of the logic control circuit 90.

Figure 3:
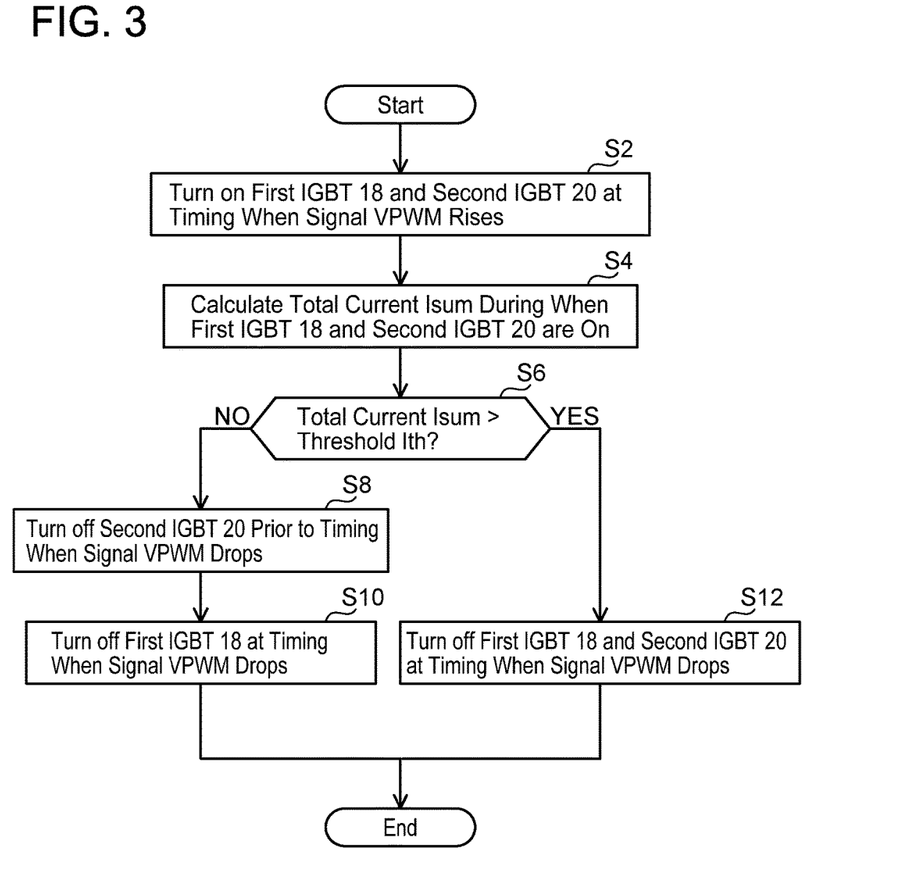
FIG. 3 is a flow chart showing operations of the switching circuit 16.
Figure 4:
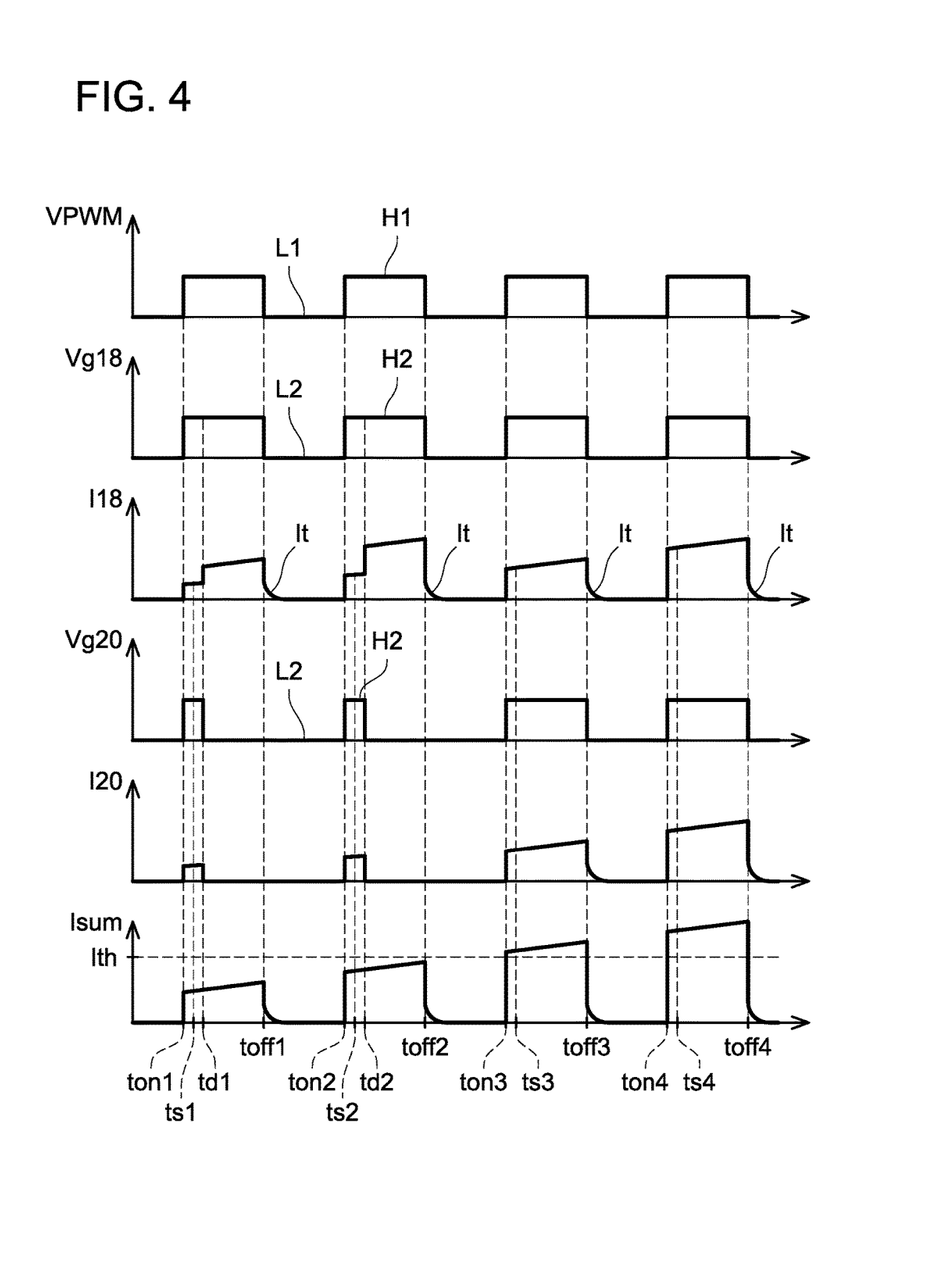
FIG. 4 is a graph showing respective values during the operations of the switching circuit 16.

Next, operations of e switching circuit 16 will be described. FIG. 3 shows processes carried out by the switching circuit 16. The switching circuit 16 repeats the processes shown in FIG. 3. Further, FIG. 4 shows changes in values of respective values during the operations of the switching circuit 16. As shown in FIG. 4, the signal VPWM is a pulse signal that repeatedly changes between a low potential L1 and a high potential H1. Further, the gate potentials Vg18, Vg20 are controlled between a low potential L2 and a high potential H2. The low potential 12 is a potential lower than a gate threshold, and the high potential H2 is a potential higher than the gate threshold. That is, an IGBT is off during when the low potential L2 is being applied, and the IGBT is on during when the high potential H2 is applied.

During when the signal VPWM is at the low potential L1, the gate potentials Vg18, Vg20 are maintained at the low potential L2 by the controller 90a. When the signal VPWM rises from the low potential L1 to the high potential H1, this rise in the signal VPWM is detected by the controller 90a. At this occasion, in step S2, the controller 90a raises the gate potential Vg18 and the gate potential Vg20 from the low potential L2 to the high potential H2 at substantially same time as a timing when the signal VPWM rises. Accordingly, in step S2, both the first IGBT 18 and the second IGBT 20 turn on, and the main current I18, I20 start to flow in the first IGBT 18 and the second IGBT 20 respectively.

In step S4, the total current calculator 90d calculates the total current Isum while the first IGBT 18 and the second IGBT 20 are in an on-state. More specifically, the current detector 90b detects the main current I18 flowing in the first IGBT 18. Further, the current detector 90c detects the main current I20 flowing in the second IGBT 20. Then, the total current calculator 90d adds the main current I18 of the first IGBT 18 and the main current I20 of the second IGBT 20 to calculate the total current Isum. This process step S4 is carried out during when the first IGBT 18 and the second IGBT 20 are in the on-state.

In step S6, the controller 90a determines whether or not the total current calculated in step S4 is higher than a threshold Ith. In a case where the total current Isum is equal to or lower than the threshold Ith (NO in step S6), the controller 90a carries out steps S8, S10, and in a case where the total current Isum is higher than the threshold Ith (YES in step S6), the controller 90a carries out step S12.

In the case where the total current Isum is determined as being equal to or lower than the threshold Ith in step S6, the controller 90a lowers the gate potential Vg20 to the low potential L2 in step S8. Due to this, the second IGBT 20 turns off without the first IGBT 18 being turned off. This step S8 is carried out prior to a timing when the signal VPWM drops from the high potential H1 to the low potential L1. At this occasion, the controller 90a maintains the first IGBT 18 in the on-state.

In step S10, the signal VPWM drops from the high potential H1 to the low potential L1, and this drop in the signal VPWM is detected by the controller 90a. The controller 90a lowers the gate potential Vg18 to the low potential L2 at substantially same time as a timing when the signal VPWM drops. Due to this, the first IGBT 18 is turned off. As a result, both the first IGBT 18 and the second IGBT 20 come to be in an off-state.

On the other hand, in the case where the total current Isum is determined as being higher than the threshold Ith in step S6, the controller 90a maintains the first IGBT 18 and the second IGBT 20 in the on-state for a while. Thereafter, when the signal VPWM drops from the high potential H1 to the low potential L1, this drop in the signal VPWM is detected by the controller 90a. Then, in step S12, the controller 90a lowers the gate potential Vg18 and the gate potential Vg20 to the low potential L2 at substantially same time as a timing when the signal VPWM drops. Due to this, both the first IGBT 18 and the second IGBT 20 are turned off. That is, the controller 90a maintains both the first IGBT 18 and the second IGBT 20 in the on-state until the timing when the signal VPWM drops, and turns both the first IGBT 18 and the second IGBT 20 off at the timing when the signal VPWM drops.

When both the first IGBT 18 and the second IGBT 20 shift to the off-state in step S10 or S12, the controller 90a then maintains the first IGBT 18 and the second IGBT 20 in the off-state until an oncoming timing when the signal VPWM rises from the low potential L1 to the high potential H1 again. When the signal VPWM rises from the low potential L1 to the high potential H1 again, the processes of FIG. 3 are repeated.

The processes of FIG. 3 will be described according to an example of FIG. 4. FIG. 4 shows four pulses of the signal VPWM. The timings when the signal VPWM rises from the low potential L1 to the high potential H1 are indicated as on-timings ton1 to ton4, and the timings when the signal VPWM drops from the high potential H1 to the low potential L1 are indicated as off timings toff1 to toff4.

At the first on-timing ton1, the controller 90a turns on the first IGBT 18 and the second IGBT 20 by raising the gate potentials Vg18 and Vg20 from the low potential L2 to the high potential H2 (step S2). In so doing, the current I18 flows in the first IGBT 18, and the current I20 flows in the second IGBT 20. Since the current flowing in the parallel circuit 30 flows by being distributed to the first IGBT 18 and the second IGBT 20, excessively large current is suppressed from flowing in the first IGBT 18 and the second IGBT 20. Steps S4 and S6 are carried out at a timing ts1, which is immediately after the on-timing ton1. That is, the total current calculator 90d calculates the total current Isum at the timing ts1 (step S4). Further, the controller 90a determines whether or not the total current Isum is higher than the threshold Ith (step S6). As shown in FIG. 4, since the total current Isum is lower than the threshold Ith at the timing ts1, a determination of NO is made in step S6. Then, step S8 is carried out at a timing td1, which is immediately thereafter. In step S8, the controller 90a lowers the gate potential Vg20 to the low potential L2 while maintaining the gate potential Vg18 at the high potential H2. Due to this, the second IGBT 20 turns off while the first IGBT 18 is maintained in the on-state. As a result, the current starts to flow by being accumulated in the first IGBT 18, and the main current I18 of the first IGBT 18 rises to a same value as the total current Isum. However, since the total current Isum is low, the current flowing in the first IGBT 18 will not become excessively large even if the current flows by being accumulated in the first IGBT 18. Further, in a case where the second IGBT 20 turns off without the first IGBT 18 being turned off, a voltage between the collector and the emitter of the second IGBT 20 does not rise since the on-state of the fast IGBT 18 is maintained. Accordingly, no turn-off loss is generated in the case where the second IGBT 20 turns off without the first IGBT 18 being turned off. After this, the signal VPWM drops from the high potential H1 to the low potential L1 at the off-timing toff1. At this occasion, the controller 90a turns off the first IGBT 18 by lowering the gate potential Vg18 from the high potential H2 to the low potential L2 (step S10). By turning the first IGBT 18 off, an entirety of the parallel circuit 30 shifts to an of state. When the first IGBT 18 turns off, a voltage between the collector and emitter of the first IGBT 18 rises. Further, carriers existing within a semiconductor layer of the first IGBT 18 are discharged to outside when the first IGBT 18 turns off. Due to this, as shown in FIG. 4, current It (so-called tail current) flows in the first IGBT 18 immediately after the off-timing toff1 in a forward direction. Since the tail current It flows under a state in which the voltage between the collector and emitter is high, a turn-off loss is generated in the first IGBT 18. In a case where the current I18 prior to the turn-off is low, the tail current It is substantially proportional to a size of the semiconductor layer to be turned off. In the first embodiment, since only the first IGBT 18 turns off without the first IGBT 18 being turned off at the off-timing toff1, the size of the semiconductor layer to be turned off is small. Accordingly, the tail current It is less likely to be generated at the off-timing toff1. Thus, the loss caused by the tail current It (turn-off loss) can be suppressed. After this, during a period from the of toff1 to the oncoming on-timing ton2, the first IGBT 18 and the second IGBT 20 are maintained in the off-state.

Since the total current Isum is lower than the threshold Ith during a period from the on-timing ton2 to the off-timing toff2, the first IGBT 18 and the second IGBT 20 are controlled in a same manner as in the aforementioned period from the on-timing ton1 to the off-timing toff1.

After this, at the on-timing ton3, the first IGBT 18 and the second IGBT 20 turn on (step S2). Then, the current I18 flows in the first IGBT 18, and the current I20 flows in the second IGBT 20. At this occasion, the total current Isum is higher than the threshold Ith. That is, high current flows in the parallel circuit 30. However, since the current flowing in the parallel circuit 30 flows by being distributed to the first IGBT 18 and the second IGBT 20, excessively large current is suppressed from flowing in the first IGBT 18 and the second IGBT 20. Thereafter, at a timing ts3, the total current calculator 90d calculates the total current Isum (step S4). Further, the controller 90a determines in step S6 that the total current Isum is higher than the threshold Ith. That is, a determination of YES is made in step S6. Then, the controller 90a maintains the first IGBT 18 and the second IGBT 20 in the on-state from the timing ts3 and thereafter. The controller 90a maintains the first IGBT 18 and the second IGBT 20 in the on-state until the off-timing toff3. As above, when the total current Isum is high, the first IGBT 18 and the second IGBT 20 are maintained in the on-state so that the current is prevented from accumulating in one of the IGBTs. Thus, the excessively large current is prevented from flowing in one of the IGBTs. After this, the signal VPWM drops from the high potential H1 to the low potential L1 at the off-timing toff3. At this occasion, the controller 90a turns off the first IGBT 18 and the second IGBT 20 by lowering the gate potential Vg18 and the gate potential Vg20 from the high potential 12 to the low potential L2 (step S12).

Since the total current Isum is higher than the threshold Ith during a period from the on-timing ton4 to the off-timing toff4, the first IGBT 18 and the second IGBT 20 are controlled in a same manner as in the aforementioned period from the on-timing ton3 to the off-timing toff3.

As described above, in the switching circuit 16, both the first IGBT 18 and the second IGBT 20 are turned on at the on-timing ton. Although it is difficult to accurately predict the total current Isum that is to flow at the on-timing ton, by turning on both the first IGBT 18 and the second IGBT 20 at the on-timing ton, the current can be flown by being distributed to the first IGBT 18 and the second IGBT 20 even in the case where the total current Isum is high. Thus, excessively large current can be prevented from flowing in the first IGBT 18 and the second IGBT 20 at the on-timing ton. Further, the total current Isum is detected at the timing is when both the first IGBT 18 and the second IGBT 20 are on. In the case where the total current Isum is equal to or lower than the threshold Ith, only the second IGBT 20 is turned off, and then the remaining first IGBT 18 is turned off at the off-timing toff. Due to this, the tail current It generated when the first IGBT 18 turns off is suppressed, as a result of which the turn-off loss can be suppressed. Further, in the case where the total current Isum is higher than the threshold Ith, the first IGBT 18 and the second IGBT 20 are maintained in the on-state until the off timing toff. Due to this, excessively large current is prevented from flowing in each of the IGBTs. As above, according to the switching circuit 16, the control can accurately be switched according to the total current Isum flowing in the parallel circuit 30 while suppressing excessively large current.

Second Embodiment

Figure 5:
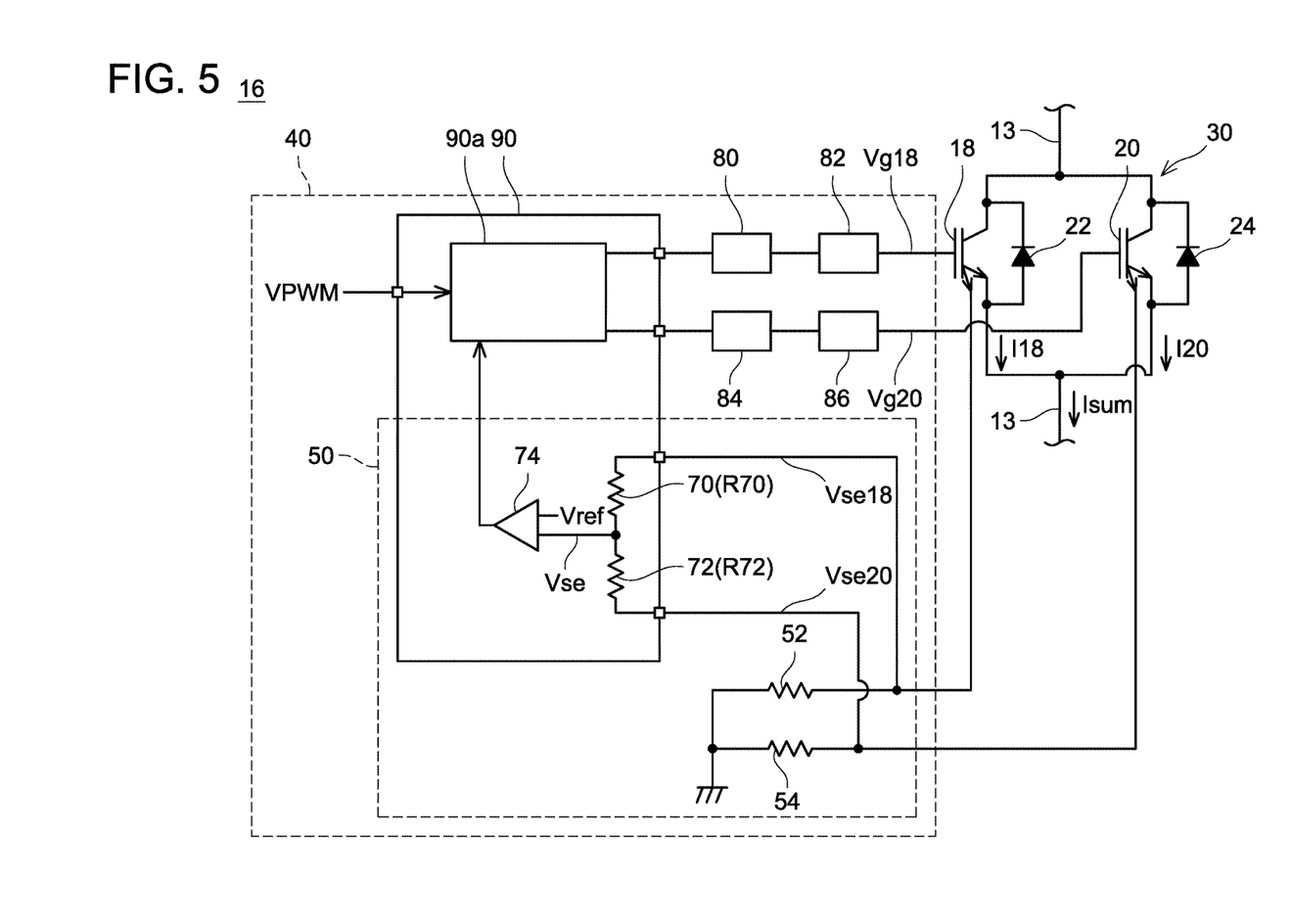
FIG. 5 is a circuit diagram of a switching circuit of a second embodiment.

FIG. 5 shows a switching circuit of a second embodiment. In the switching circuit of the second embodiment, a configuration of a current detection circuit 50 differs from the switching circuit 16 of the first embodiment. That is, the switching circuit of the second embodiment includes resistances 70, 72 and a comparator 74 instead of the current detectors 90b, 90c and the total current calculator 90d (see FIG. 2). One end of the resistance 70 is connected to the sensing emitter of the first IGBT 18. The other end of the resistance 70 is connected to one end of the resistance 72. The other end of the resistance 72 is connected to the sensing emitter of the second IGBT 20. A connection portion of the resistance 70 and the resistance 72 is connected to one of input terminals of the comparator 74. A reference potential Vref is applied to the other of the input terminals of the comparator 74. An output terminal of the comparator 74 is connected to the controller 90a.

In the configuration of FIG. 5, a voltage dividing circuit is configured by the resistances 70 and 72. A potential Vse at the connection point of the resistances 70 and 72 is a potential that divided the potential Vse18 of the sensing emitter of the first IGBT 18 and the potential Vse20 of the sensing emitter of the second IGBT 20. More specifically, in assuming that the resistance 70 has a resistance value R70, and the resistance 72 has a resistance value R72, the potential Vse satisfies a relationship: Vse=(R72\*Vse18+R70\*Vse20)/(R70+R72). Since R70=R72 is established in this embodiment, the potential Vse becomes an average of the potential Vse18 and the potential Vse20. Since each of the potentials Vse18, Vse20 is substantially proportional to its corresponding main current I18, I20 flowing in the corresponding one of the first and second IGBTs 18, 20, the potential Vse takes a value corresponding to the total current Isum flowing in the parallel circuit 30. Thus, outputting the potential Vse is equivalent to detecting the total current Isum. That is, in the second embodiment, the process of step S4 of FIG. 3 is carried out by the voltage dividing circuit. The comparator 74 determines whether or not the potential Vse is higher than the reference potential Vref (that is, whether or not the total current Isum is higher than the threshold Ith), and sends a determination result to the controller 90a. That is, the comparator 74 carries out the determination of step S6 of FIG. 3. The controller 90a carries out steps S8 and S10 or S12 of FIG. 3 according to the determination result of the comparator 74. In the configuration of the second embodiment, the voltage Vse corresponding to the total current Isum is generated by the voltage dividing circuit, and this enables faster processing.

Figure 6:
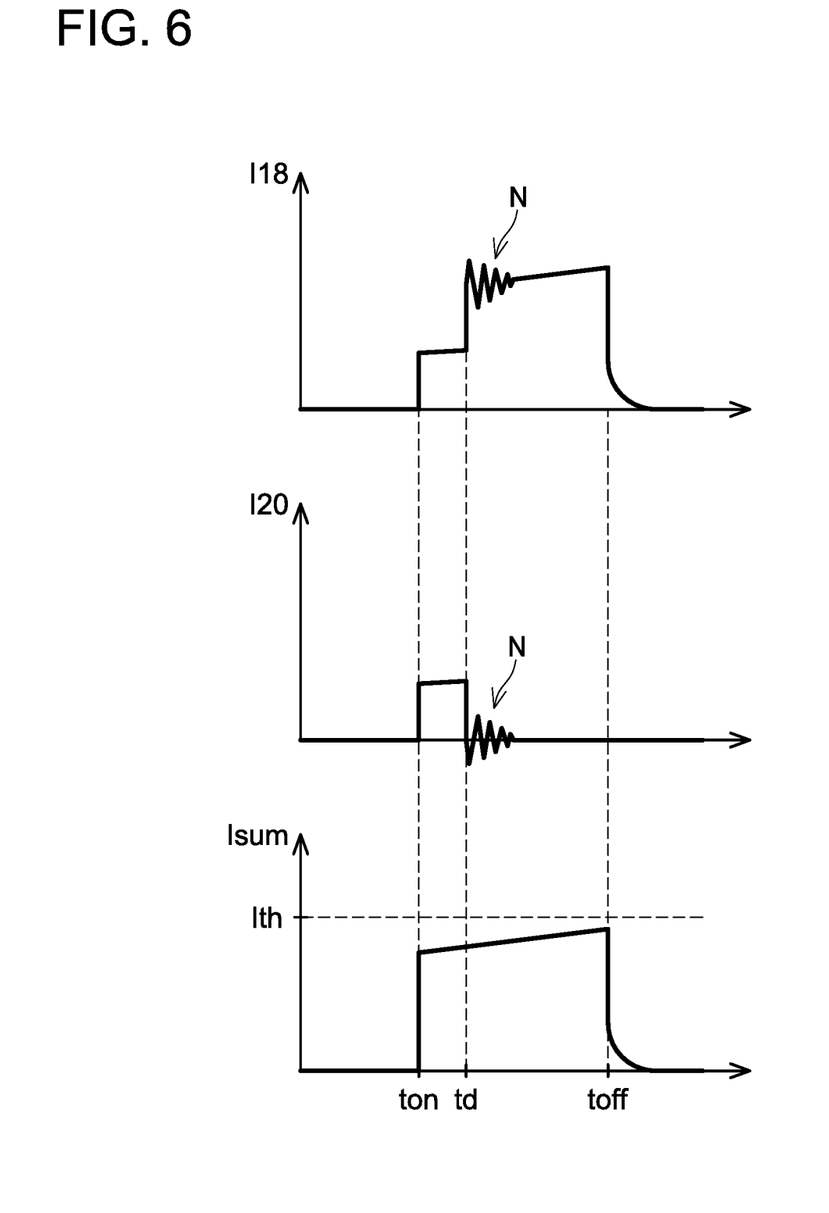
FIG. 6 is a graph showing noise generated between two IGBTs.

It should be noted that, although the total current Isum flowing in the parallel circuit 30 was detected in the aforementioned first and second embodiments, one of the current I18 of the first IGBT 18 and the current I20 of the second IGBT 20 may be detected. Since the current flowing in one of the IGBTs is substantially proportional to the total current Isum flowing in the parallel circuit 30, and as such, detecting the current flowing in one of the IGBTs and carrying out the determination is equivalent to carrying out the determination based on the total current Isum. However, when only one of the IGBTs is turned off in step S8, the current of the other IGBT doubles. Due to this, if an overcurrent detection threshold is set to the current flowing in one of the IGBTs, changes to the threshold become required according to the control state, so the control logic becomes complicated. Further, as shown in FIG. 6, interference may occur between the first IGBT 18 and the second IGBT 20 when the second IGBT 20 is to be turned off (at the timing td), and noise N may be generated thereby. In the case of detecting the current of the one of the IGBTs, an influence of the noise N as show in FIG. 6 may be imposed. Contrary to this, as shown in FIG. 6, no noise is generated in the total current Isum even if the interference occurs between the first IGBT 18 and the second IGBT 20. Thus, the detection of the total current Isum enables to further resist the influence of the noise.

Figure 7:
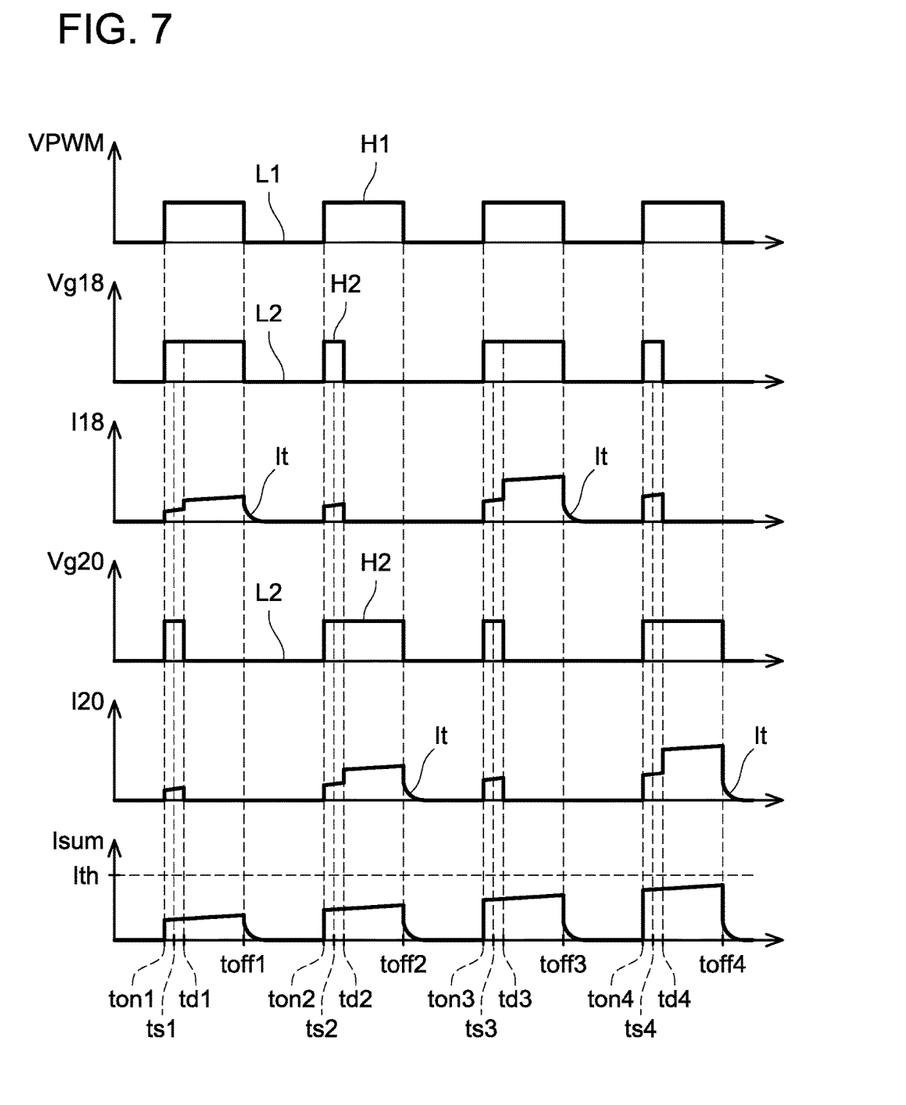
FIG. 7 is a graph showing operations of a variant of the first and second embodiments.

Further, in the aforementioned first and second embodiments, when the total current Isum is equal to or lower than the threshold Ith, the second IGBT 20 is firstly turned off and the first IGBT 18 is thereafter turned off. However, in this configuration, an electrically conducted period of the first IGBT 18 becomes longer than an electrically conducted period of the second IGBT 20. Accordingly, as shown in FIG. 7, during when the total current Isum is equal to or lower than the threshold, periods in which the first IGBT 18 is turned off first (a period from the timing ton2 to toff2 and a period from the timing ton4 to toff4) and periods in which the second IGBT 20 is turned off first (a period from the timing ton1 to toff1 and a period from the timing ton3 to toff3) may be configured to appear alternately. According to this configuration, the electrically conducted period of the first IGBT 18 and the electrically conducted period of the second IGBT 20 can further be equalized. Due to this, load applied to the first IGBT 18 and load applied to the second IGBT 20 can further be equalized.

Further, in the aforementioned embodiments, the first IGBT 18 and the second IGBT 20 were connected in parallel, however, there may be another IGBT connected in parallel to the first IGBT.

Relationships of constituent features of the aforementioned embodiments and constituent features of the claims will be described. The signal VPWM in the embodiments is an example of "a signal indicating a turn-on timing and a turn-off timing" in the claims. Steps S8 and S10 in the embodiments are an example of "a first control" in the claims. Step S12 in the embodiments is an example of "a second control" in the claims.

Some of the technical features disclosed in the present teachings will be listed hereinbelow. It should be noted that each of the below technical features is independently useful.

In one configuration example disclosed herein, the controller may comprise a detection circuit configured to detect a total amount of current flowing through the first IGBT and current flowing through the second IGBT. In this case, the controller is configured to execute the first control or the second control according to the total amount when both of the first and second IGBTs are in the on-state.

According to this configuration, the first and second controls can accurately be performed according to the current flowing in the parallel circuit.

In one configuration example disclosed herein, the controller may comprise a voltage dividing circuit configured to receive a voltage corresponding to current flowing through the first IGBT and a voltage corresponding to current flowing through the second IGBT. In this case, the controller is configured to execute the first control or the second control according to a voltage output from the voltage dividing circuit when both of the first and second IGBTs are in the on-state.

According to this configuration, the first and second controls can accurately be performed according to the current flowing in the parallel circuit using a simple circuit configuration.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously and satisfying any one of those objectives gives technical utility to the present invention.

What is claimed is:

1. A switching circuit, comprising:
   a wiring;
   a parallel circuit arranged on the wiring, and including a first IGBT and a second IGBT connected in parallel;
   a controller configured to receive a signal indicating a turn-on timing and a turn-off timing and switch one or both of the first and second IGBTs according to the signal,
   wherein
   the controller is configured to:

turn on both of the first and second IGBTs at the turn-on timing, execute a first control in which one of the first and second IGBTs is turned off before the turn-off timing and the other of the first and second IGBTs is turned off at the turn-off timing in a case where current flowing through the parallel circuit when both of the first and second IGBTs are in an on-state is equal to or lower than a threshold, and execute a second control in which both of the first and second IGBTs are turned off at the turn-off timing in a case where the current flowing through the parallel circuit when both of the first and second IGBTs are in the on-state is higher than the threshold.

2. The switching circuit of claim 1, wherein
the controller comprises a detection circuit configured to detect a total amount of current flowing through the first IGBT and current flowing through the second IGBT, and the controller is configured to execute the first control or the second control according to the total amount when both of the first and second IGBTs are in the on-state.

3. The switching circuit of claim 1, wherein
the controller comprises a voltage dividing circuit configured to receive a voltage corresponding to current flowing through the first IGBT and a voltage corresponding to current flowing through the second IGBT, and the controller is configured to execute the first control or the second control according to a voltage output from the voltage dividing circuit when both of the first and second IGBTs are in the on-state.

* * * * *